(12) United States Patent
Huang et al.

(10) Patent No.: US 8,341,562 B1
(45) Date of Patent: Dec. 25, 2012

(54) REDUCING METAL PITS THROUGH OPTICAL PROXIMITY CORRECTION

(75) Inventors: Jiun-Jie Huang, Kaohsiung (TW); Chi-Yen Lin, Tainan (TW); Ling-Sung Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/188,166

(22) Filed: Jul. 21, 2011

(51) Int. Cl.
*G06F 17/50* (2006.01)

(52) U.S. Cl. ............... 716/55; 716/51; 716/52; 716/53; 716/54

(58) Field of Classification Search ............... 716/51–55
See application file for complete search history.

(56) References Cited

U.S. PATENT DOCUMENTS

2011/0241207 A1* 10/2011 Kuo et al. ................ 257/741

* cited by examiner

*Primary Examiner* — Suresh Memula
(74) *Attorney, Agent, or Firm* — Slater & Matsil, L.L.P.

(57) ABSTRACT

A method includes retrieving first layouts of an integrated circuit from a non-transitory computer-readable medium. The first layouts include a via pattern in a via layer, and a metal line pattern in a metal layer immediately over the via layer. The metal line pattern has an enclosure to the via pattern. The enclosure is increased to a second enclosure to generate second layouts of the integrated circuit.

10 Claims, 4 Drawing Sheets

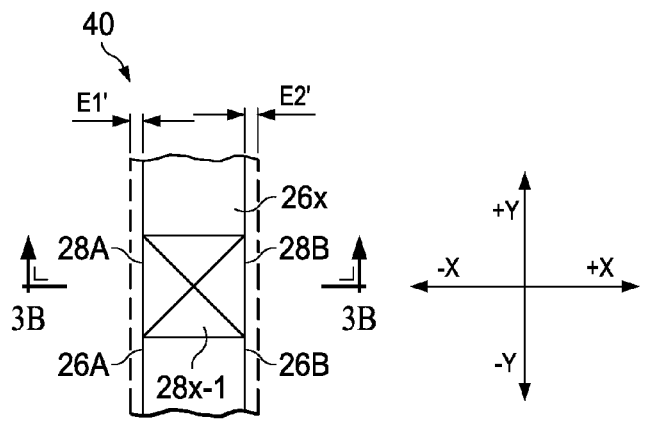
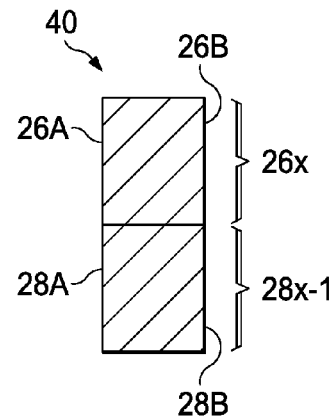
FIG. 3A  FIG. 3B
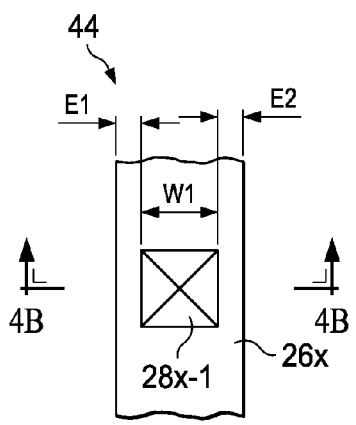
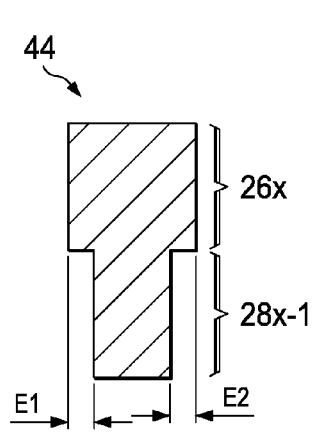
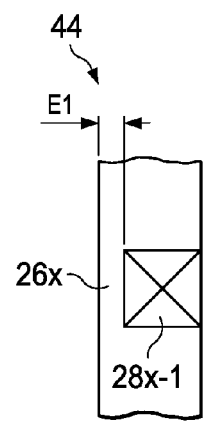
FIG. 4A  FIG. 4B  FIG. 4C
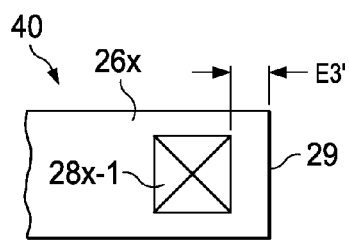
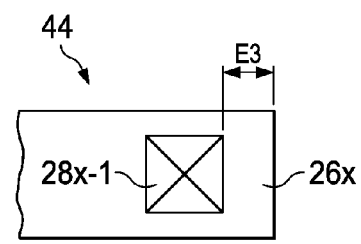
FIG. 5A  FIG. 5B

REDUCING METAL PITS THROUGH OPTICAL PROXIMITY CORRECTION

BACKGROUND

Integrated circuit devices such as transistors are formed on semiconductor wafers. The integrated circuit devices are interconnected as functional circuits through the metal lines and vias (commonly referred to as metal layers). There may be up to nine metal layers in a semiconductor wafer. The formation of the metal lines and vias are referred to as a back-end-of-process. The formation of the metal layers typically involves damascene processes, wherein copper is used to form the metal layers.

The yield in the manufacture of the metal layers significantly affects the overall yield in the manufacturing of the integrated circuits. Therefore, the problems that have the most effect on the yield need to be handled as a priority. It has been found that the generation of copper pits is the number-one problem in the back-end-of-process. Statistic results have shown that the yield loss caused by copper pits may reach as high as about 20 percent among all yield loss in the back-end-of-process.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 3A and 3B illustrate a top view and a cross-sectional view of a via, and a metal line immediately over the via, wherein the metal line and the via are in the un-modified layouts of an integrated circuit;

FIGS. 4A through 4C illustrate top views and a cross-sectional view of a via and a metal line immediately over the via, wherein the metal line and the via are in the modified layouts of the integrated circuit, and wherein line-edge enclosures of the via are increased over that in FIGS. 3A and 3B;

FIGS. 5A and 5B illustrate the increase in a line-end enclosure of a via pattern in accordance with an embodiment.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A method of reducing copper pits is provided in accordance with an embodiment. The variations of the embodiment are discussed. Throughout the various views and illustrative embodiments, like reference numbers are used to designate like elements.

Figure 1:
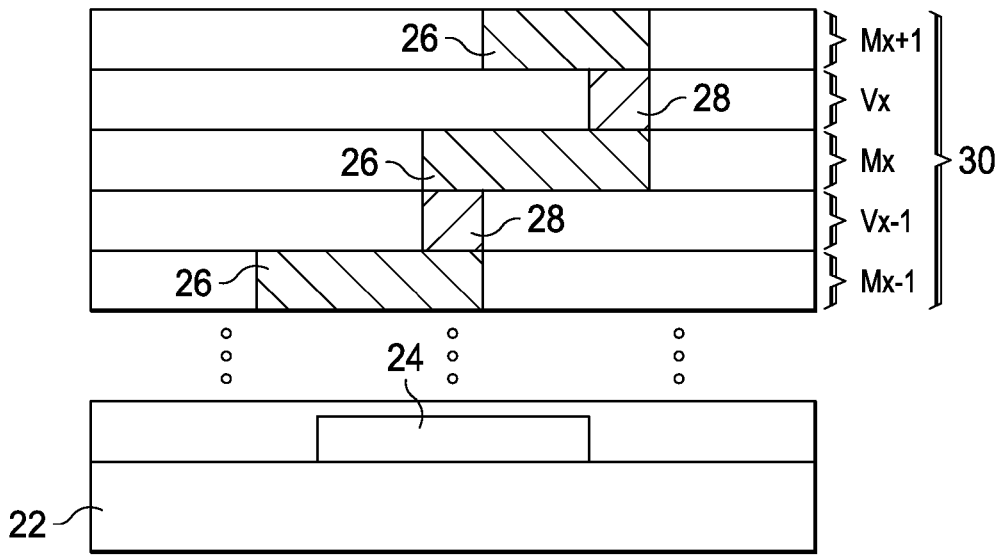
FIG. 1 illustrates a cross-sectional view of a semiconductor chip.

FIG. 1 illustrates a cross-sectional view of physical semiconductor chip 20, wherein semiconductor chip 20 may be a portion of a physical semiconductor wafer. Semiconductor chip 20 includes semiconductor substrate 22, which may be a silicon substrate, or may be formed of other semiconductor materials. Integrated circuit devices 24 are formed at a surface of semiconductor substrate 22. Integrated circuit devices 24 may include transistors, diodes, capacitors, inductors, and the like. A plurality of metal layers 30 are formed over semiconductor substrate 22. Metal layers 30 may include metal lines 26 and vias 28, which may be electrically connected to integrated circuit devices 24. FIG. 1 illustrate metal layers Mx−1, Mx, and Mx+1, and via layers Vx−1 and Vx, wherein integer x is equal to 2 or greater. Throughout the description, reference numerals of the metal features may be post-suffixed by "x−1," "x," and "x+1" to indicate the respective layers of the illustrated features.

Metal layer Mx is the layer immediately over via layer Vx−1, with no additional metal layer and via layer formed therebetween. Metal layer Mx+1 is the layer immediately over via layer Vx, with no additional metal layer and via layer therebetween. Metal layer Mx and via layer Vx−1 may form dual damascene structures, and metal layer Mx+1 and via layer Vx may form dual damascene structures. Accordingly, there may be no diffusion barrier separating metal lines 26 in metal layer Mx from vias 28 in via layer Vx−1, and there may be no diffusion barrier separating metal lines 26 in metal layer Mx+1 from vias 28 in via layer Vx.

Figure 6A:
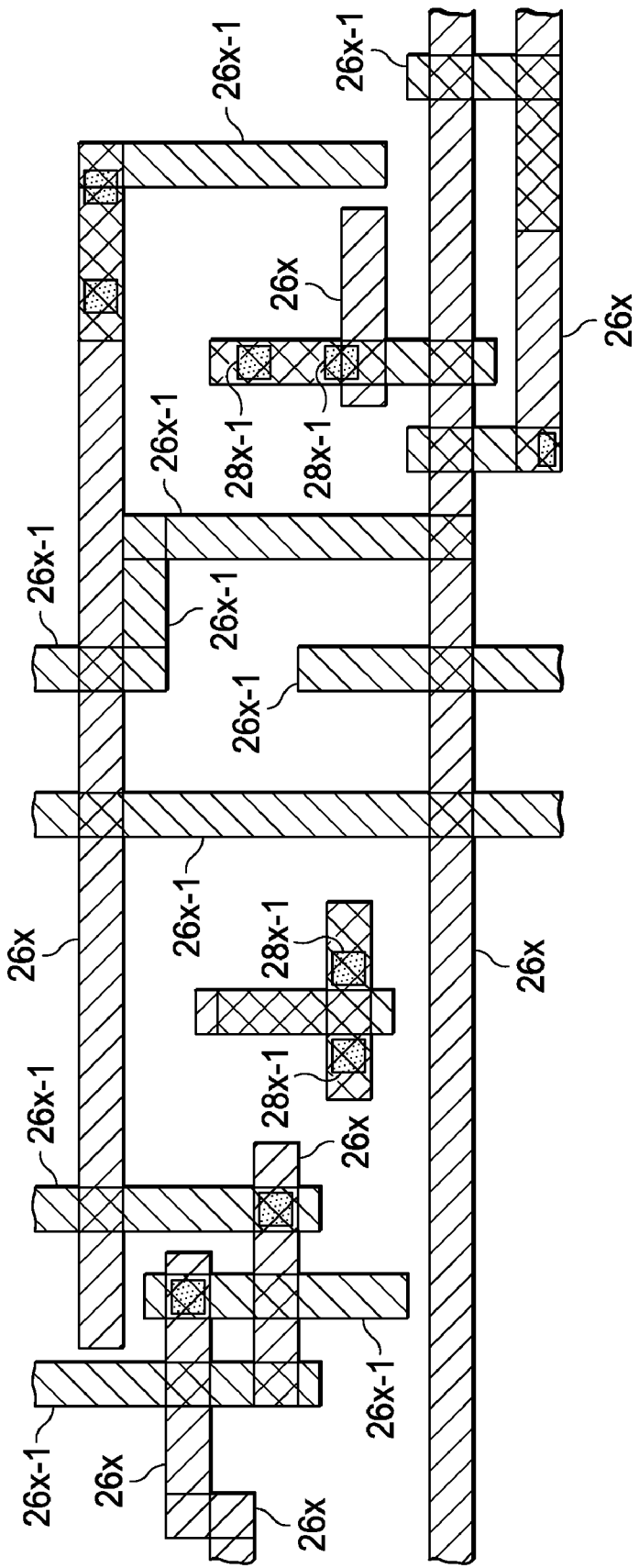
FIGS. 6A and 6B illustrate the increase in line-end enclosures and side-edge enclosures of via patterns in accordance with various embodiments.

In the manufacturing of the metal layers of chip 20, layouts 40 (FIG. 2) of chip 20 (including metal layers 30) are provided. FIG. 6A illustrates exemplary layouts 40 of metal layers Mx−1 and Mx and via layer Vx−1. The layouts of metal features include metal lines 26x−1 in metal layers Mx−1 and metal lines 26x in metal layers Mx. Furthermore, vias 28x−1 are in via layer Vx−1 and connect metal lines 26x−1 to metal lines 26x.

Figure 2:
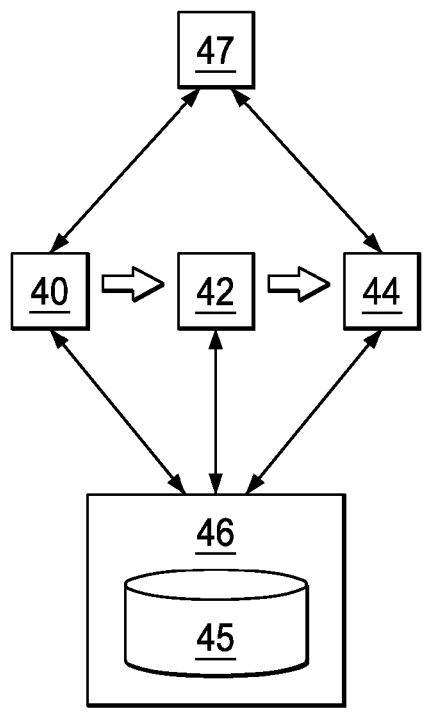
FIG. 2 illustrates a pattern enhancer in accordance with embodiments, wherein the pattern enhancer is configured to process metal line patterns and via patterns in first layouts (un-modified layouts) to generate second layouts (modified layouts) having enhanced patterns.

FIG. 2 illustrates an exemplary block diagram in accordance with embodiments. Un-modified layouts 40 (also refer to FIG. 6A) of an integrated circuit are provided to pattern enhancer 42 to generate modified layouts 44 (also refer to FIG. 6B). Un-modified layouts 40 include the layouts of metal layers and via layers such as what are shown in FIG. 1. Pattern enhancer 42 may be a software (program codes) located in computer 46, and is configured to recognize the patterns of metal features (such as metal lines 26x−1/26x and vias 28x−1 as in FIG. 6A), modify the patterns, and generate modified layouts 44. Pattern enhancer 42 may also include hardware. Alternatively, pattern enhancer 42 may include software (computer program codes), but does not include hardware. The program codes of pattern enhancer 42 may be embodied on a non-transitory and tangible computer-readable storage medium (also illustrated as 45), such as a hard drive, a disc, or the like. In addition, un-modified layouts 40 and modified layouts 44 may be retrieved from and saved into non-transitory and tangible computer-readable storage medium 47.

Un-modified layouts 40 may be provided by a design house. Before the manufacturing of physical chip 20, which is intended to include the patterns in un-modified layouts 40, pattern enhancer 42 is executed to generate modified layouts 44, and the modified patterns in modified layouts 44, rather than the patterns in un-modified layouts 40, are manufactured on chip 20. Pattern enhancer 42 may modify the layouts of integrated circuits through an optical proximity correction (OPC) process, which is performed using an OPC tool (not shown).

FIGS. 3A through 6B illustrate the processing of un-modified layouts 40 by pattern enhancer 42, and the resulting modified layouts 44. In the following discussion, the terms "metal line" and "via" are used to refer to the patterns of the metal lines and the vias in layouts 40 and 44. Referring to FIG. 3A, a top view of a portion of metal line 26x and the underlying via 28x–1 are illustrated. Metal line 26x extends in the +Y and −Y directions. The left edge 26A and right side edge 26B (in the +X and −X directions) of metal line 26x are substantially aligned to the left side edge 28A and right side edge 28B of via 28x–1, respectively. Accordingly, via 28x–1 is referred to as a borderless via (pattern) since the overlying metal line 26x does not have enclosures (extensions) that extend beyond the side edges of via 28x–1. FIG. 3B illustrates a cross-sectional view of the structure shown in FIG. 3A, wherein the cross-sectional view shown in FIG. 3B is obtained from the plane crossing line 3B-3B in FIG. 3A.

Un-modified layouts 40 as shown in FIGS. 3A and 3B are modified by pattern enhancer 42 (FIG. 2) to generate modified layouts 44 as shown in FIGS. 4A through 4C. Via 28x–1, after being modified, becomes a non-borderless via, wherein side-edge enclosures E1 and E2 are added. Alternatively stating, side-edge enclosures E1 and E2 are increased from zero nanometer as in FIGS. 3A and 3B to non-zero values. Side-edge enclosures E1 and E2 are measured in the widthwise direction of metal line 26x. The values of E1 and E2 may depend on the technology for forming the integrated circuits. In some embodiments, side-edge enclosures E1 and E2 may be between about 20 nm and about 40 nm. Ratio E1/W1 or ratio E2/W1 may also be between about 0.4 and about 0.5 in some embodiments, wherein width W1 (FIG. 4A) is the width of via 28x–1. Width W1 is measured in the widthwise direction of metal line 26x. It is realized, however, that the dimensions recited throughout the description are merely examples, and may be changed to different values. In alternative embodiments, as shown in FIG. 4C, one of side-edge enclosures E1 and E2 (such as E1) is increased to a non-zero value, while the other one (such as E2) remains to be zero nm.

In alternative embodiments, in un-modified layouts 40 such as what is shown in FIG. 3A, the side edges of metal line 26x are illustrated using dashed lines, and one or both of side-edge enclosures E1' and E2' is greater than zero nm. However, enclosures E1' and E2' are smaller than the pre-determined threshold side-edge enclosures. Accordingly, pattern enhancer 42 (FIG. 2) may increase the side-edge enclosures from E1' and E2' to E1 and E2, respectively, as in FIGS. 4A and 4B.

FIGS. 5A and 5B illustrate un-modified layouts 40, and the respective modified layouts 44, respectively. Referring to FIG. 5A, via 28x–1 is formed close to line end 29 of the overlying metal line 26x. Metal line 26x extends beyond the side edge of via 28x–1 by distance E3', which is referred to as a line-end enclosure. Line-end enclosure E3', which is the distance that an end of line 26x extends beyond the respective side edge of via 28x–1, may be equal to or greater than 0 nm. In accordance with embodiments, un-modified layouts 40 as in FIG. 5A are provided to pattern enhancer 42 (FIG. 2) to generate modified layouts 44 as in FIG. 5B. Pattern enhancer 42 increases the line-end enclosure from E3' in FIG. 5A to E3 in FIG. 5B. In an embodiment, line-end enclosure E3 may be between about 50 nm and about 70 nm, although different values may be used. The increment ratio (E3–E3')/E3' of line-end enclosure may be between about 0.8 and about 0.9 in some embodiments. In the embodiment wherein opposite ends of metal line 26x are both close to via 28x–1, which means there exist line-end enclosures on the opposite sides of via 28x–1, the line-end enclosures on opposite ends of metal line 26 may both be increased.

Figure 6B:
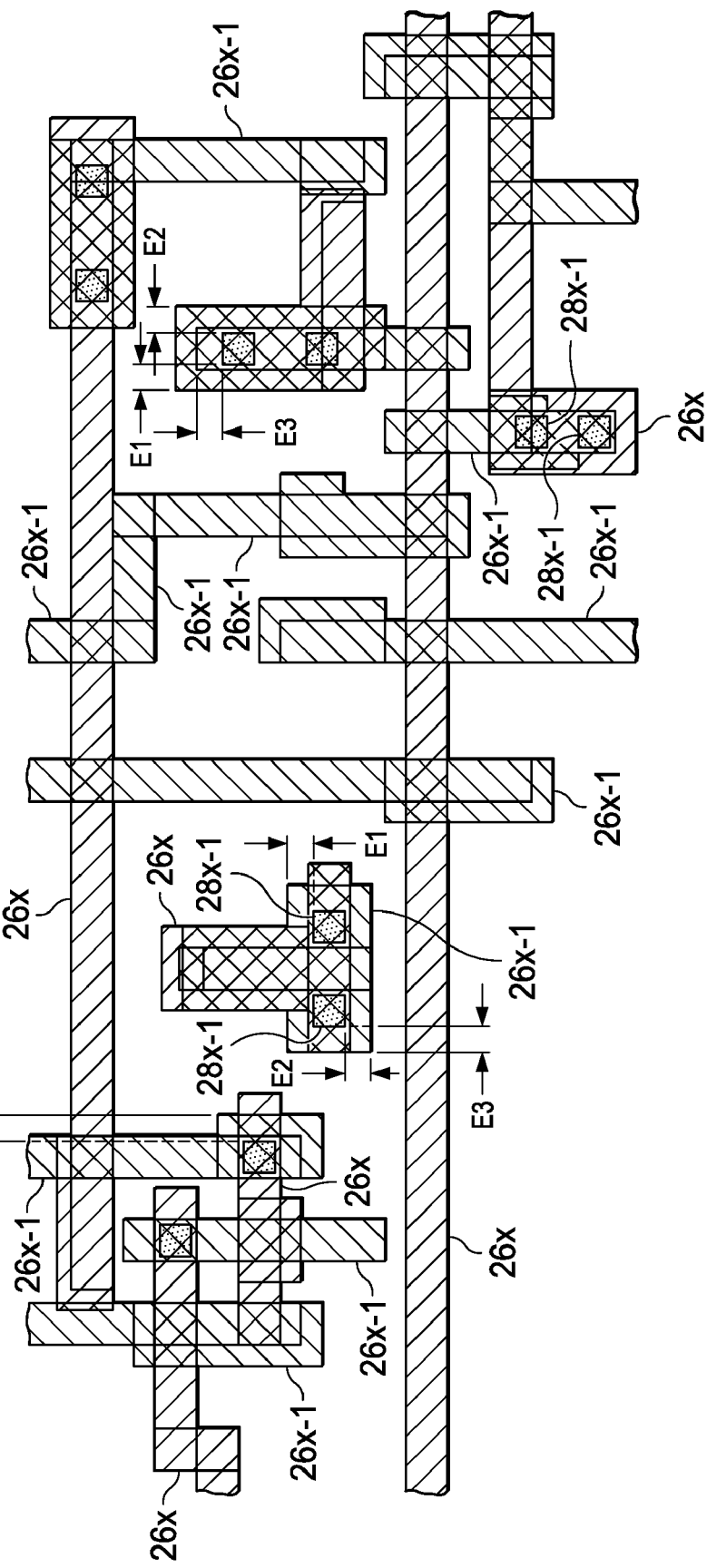

In the case a via is a borderless via, and is also close to a line end of the overlying connecting metal line, both side-edge enclosures and line-end enclosures may be increased. For example, FIGS. 6A and 6B illustrate the modified layout 44 generated from un-modified layouts 40. It is observed that enclosures E1, E2, and E3 in FIG. 6B are increased over the respective enclosures (which may be equal to or greater than 0 nm) in FIG. 6A.

In the embodiments as in FIGS. 3A through 6B, threshold enclosures may be pre-determined for a via layer, or for each of the via layers, of semiconductor chip 20 (FIG. 1). The threshold enclosures may include threshold side-edge enclosures and/or threshold line-end enclosures. The side-edge enclosures of different via layers may be equal to each other, or different from each other. Similarly, the line-end enclosures of different via layers may be equal to each other, or different from each other. When un-modified layouts of all metal layers of semiconductor chip 20 are provided to pattern enhancer 42, the via patterns in the via layers and the respective overlying metal layers are checked by pattern enhancer 42 to find out the side-edge enclosures and the line-end enclosures of the vias. If the side-edge enclosures and/or the line-end enclosures of a via are greater than the corresponding threshold side-edge enclosure and threshold line-end enclosure, pattern enhancer 42 may not modify the enclosures of the via. Otherwise, if the side-edge enclosures and/or the line-end enclosures of a via are smaller than the corresponding threshold side-edge enclosure and threshold line-end enclosure, pattern enhancer 42 modifies the enclosures of the via to be equal to or greater than the respective threshold side-edge enclosure and threshold line-end enclosure. The modified and un-modified enclosures are copied into modified layouts 44. Pattern enhancer 42 then generates and saves the modified layouts 44 to the non-transitory computer-readable storage medium 47 as in FIG. 2.

In some embodiments, all metal layers including the bottom metal layer (commonly known as M1, which is the metal layer immediately over contact plugs) and the top metal layer (commonly referred to as Mtop) may be modified by pattern enhancer 42. Accordingly, in accordance with some embodiments, referring to FIG. 1, in each of all metal layers 30, there is at least one metal line that is modified by pattern enhancer 42, so that the respective side-edge enclosures and/or the line-end enclosures are increased. In alternative embodiments, since the upper metal layers and vias are typically wider than lower metal layers, the layouts of the metal lines in upper metal layer (for example, including metal layer Mx and all overlying metal layers) are not modified by pattern enhancer 42. Accordingly, in the respective via layers of the upper metal layers, no enclosure of any via pattern is increased. On the other hand, the layouts of the metal lines in lower metal layers (for example, including metal layer Mx−1 and all underlying metal layers) are modified by pattern enhancer 42, so that in each of the corresponding layers, there is at least one via pattern whose enclosure is increased.

Referring to FIG. 2, due to the modification of pattern enhancer 42, pattern enhancer 42 may increase all enclosures that are smaller than the respective threshold enclosures. As a result, in the modified layouts 44, a via layer or all of via layers may not have any side-edge enclosure that is smaller than the respective threshold side-edge enclosure. As a comparison, in the corresponding un-modified layouts 40 from which modified layouts 44 are generated, in the same via layer, there may be one or more side-edge enclosure smaller than the threshold side-edge enclosure. Similarly, in the modified layouts 44, in one via layer or all of via layers, no line-end enclosure is smaller than the respective threshold side-edge enclosure, while in the un-modified layouts 40, there may be one or more line-end enclosure smaller than the threshold line-end enclosure.

In advanced technologies, the metal lines and vias have small widths. Accordingly, in the plating process for filling metal (such as copper) into the dual damascene openings, the process window is small. It is thus difficult to fill the metal into the trench openings and the underlying via openings. Since the formation of the via openings causes an increase in the aspect ratios of the openings, voids may be generated in the filled metal. This may cause copper pits and yield loss. By increasing the side-edge enclosures and line-end enclosures, the process window for the plating process increases, and it is less likely for voids to be generated.

In accordance with embodiments, a method includes retrieving first layouts of an integrated circuit from a non-transitory computer-readable medium. The first layouts include a via pattern in a via layer, and a metal line pattern in a metal layer immediately over the via layer. The metal line pattern has an enclosure to the via pattern. The enclosure is increased to a second enclosure to generate second layouts of the integrated circuit.

In accordance with other embodiments, a method includes pre-determining a threshold enclosure, and retrieving first layouts of a semiconductor chip from a non-transitory computer-readable medium, wherein the first layouts comprise via patterns and metal line patterns. Enclosures of the via patterns are found based on the via patterns and the metal line patterns. The enclosures of the via patterns are compared to the threshold enclosure. The metal line patterns are modified to generate second layouts of the semiconductor chip. A first portion of the enclosures of the via patterns is increased to not smaller than the threshold enclosure when the first portion of the enclosures of the via patterns is smaller than the threshold enclosure. A second portion of the enclosures is maintained not changed, and is copied to the second layouts when the second portion of the enclosures of the via patterns is not smaller than the threshold enclosure.

In accordance with yet other embodiments, a computer program product for enhancing layouts of metal line patterns and via patterns of an integrated circuit is provided. The computer program product has a non-transitory computer-readable medium with a computer program embodied thereon. The computer program includes computer program code for determining enclosures of via patterns in first layouts of the integrated circuit, computer program code for comparing the enclosures of the via patterns to threshold enclosures; and computer program code for modifying metal line patterns in the first layouts to generate second layouts of the integrated circuit. The step of modifying the metal line patterns includes increasing a first portion of the enclosures to not smaller than the threshold enclosures when the first portion of the enclosures is smaller than the threshold enclosures, and maintaining a second portion the enclosures not changed and copying the second portion of the enclosures to the second layouts when the second portion of the enclosures is not smaller than the threshold enclosures.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
pre-determining a threshold enclosure;
retrieving first layouts of a semiconductor chip from a non-transitory computer-readable medium, wherein the first layouts comprise via patterns and metal line patterns;
finding enclosures of the via patterns based on the via patterns and the metal line patterns;
comparing the enclosures of the via patterns to the threshold enclosure; and
modifying the metal line patterns to generate second layouts of the semiconductor chip, wherein the step of modifying the metal line patterns comprises:
increasing a first portion of the enclosures of the via patterns to not smaller than the threshold enclosure when the first portion of the enclosures of the via patterns is smaller than the threshold enclosure; and
maintaining a second portion of the enclosures not changed and copying the second portion of enclosures to the second layouts when the second portion of the enclosures of the via patterns is not smaller than the threshold enclosure.

2. The method of claim 1, wherein the first layouts comprise a first via layer and a second via layer over the first via layer, wherein the step of modifying is a part of a pattern enhancement step performed on all metal layers of the first layouts of the semiconductor chip, and wherein in the pattern enhancement step, the step of increasing is performed to via patterns in the second via layer and all via layers over the second via layer, and in each of the first via layer and all via layers under the first via layer, an enclosure of at least one via pattern is increased in the pattern enhancement step.

3. The method of claim 1, wherein the step of increasing the enclosures comprises increasing both a line-end enclosure and a side-edge enclosure of a via pattern.

4. The method of claim 3, wherein after the step of increasing the first portion of the enclosures, one of the via patterns is changed from a borderless via pattern to a non-borderless via pattern.

5. The method of claim 3, wherein in the first layouts, a via layer comprises at least one enclosure smaller than the threshold enclosure, and wherein in the second layouts, the via layer comprises no enclosure that is smaller than the threshold enclosure.

6. A computer program product for enhancing layouts of metal line patterns and via patterns of an integrated circuit, the computer program product having a non-transitory computer-readable medium with a computer program embodied thereon, the computer program comprising:
computer program code for determining enclosures of via patterns in first layouts of the integrated circuit;
computer program code for comparing the enclosures of the via patterns to threshold enclosures; and computer program code for modifying metal line patterns in the first layouts to generate second layouts of the integrated circuit, wherein the step of modifying the metal line patterns comprises:
increasing a first portion of the enclosures to not smaller than the threshold enclosures when the first portion of the enclosures is smaller than the threshold enclosures; and
maintaining a second portion the enclosures not changed and copying the second portion of the enclosures to the second layouts when the second portion of the enclosures is not smaller than the threshold enclosures.

7. The computer program product of claim 6, wherein the computer program code for determining the enclosures of via patterns is configured to determine side-edge enclosures of the via patterns.

8. The computer program product of claim 6, wherein the computer program code for determining the enclosures of via patterns is configured to determine via end enclosures of the via patterns.

9. The computer program product of claim 6, wherein the computer program code for determining the enclosures of via patterns is configured to modify the via patterns from borderless via patterns to non-borderless via patterns.

10. The computer program product of claim 6, wherein the computer program code for modifying the metal line patterns is capable of modifying the metal line patterns in upper metal layers and not modifying the metal line patterns in lower metal layer, and wherein the lower metal layers are below the upper metal layers.

* * * * *